(12) United States Patent
Cook

(10) Patent No.: US 8,269,540 B2
(45) Date of Patent: *Sep. 18, 2012

(54) CIRCUITRY AND METHODS FOR IMPROVING DIFFERENTIAL SIGNALS THAT CROSS POWER DOMAINS

(75) Inventor: Bryce Cook, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/039,998

(22) Filed: Mar. 3, 2011

(65) Prior Publication Data

US 2011/0148474 A1 Jun. 23, 2011

Related U.S. Application Data

(63) Continuation of application No. 12/208,562, filed on Sep. 11, 2008, now Pat. No. 7,915,937.

(51) Int. Cl.
*H03K 5/12* (2006.01)
(52) U.S. Cl. ............ 327/170; 327/333; 327/112
(58) Field of Classification Search ........... 327/108, 327/112, 170, 333, 389, 391; 326/68, 80–83; 365/189.05, 189.11, 230.06
See application file for complete search history.

(56) References Cited

U.S. PATENT DOCUMENTS

| | | | |
|---|---|---|---|
| 7,486,112 B2* | 2/2009 | Tanaka | 326/83 |
| 7,545,205 B2 | 6/2009 | Tang et al. | |
| 7,915,937 B2* | 3/2011 | Cook | 327/170 |
| 2009/0108925 A1* | 4/2009 | Tang et al. | 327/551 |

OTHER PUBLICATIONS

Micron Technical Note DDR3 ZQ Calibration (2008) (http://download.micron.com/ pdf/technotes/DDR3/TN4102.pdf).

* cited by examiner

*Primary Examiner* — Long Nguyen
(74) *Attorney, Agent, or Firm* — Schwegman, Lundberg & Woessner, P.A.

(57) ABSTRACT

Disclosed herein are circuitry and methods for improving differential signals that cross power domains. In an example embodiment, the power supply domain boundary along the output paths that generate the differential signal is staggered, such that the boundary occurs at an odd numbered stage in one differential output path and at an even numbered stage in the other differential output. Defining the power supply domain boundary in this manner can help ensure that the same logical state is present at the boundary in either of the differential output paths. This same logic signal should affect subsequent stages similarly from a speed perspective, and so should similarly affect the differential signals generated by each of the output paths. This means, among other things, that the differential signal as generated should tend to cross nearer to a midpoint voltage, which increases its compliance with certain integrated circuit specifications such as the Vox specification used for the differential data strobe in an SDRAM.

33 Claims, 16 Drawing Sheets

CIRCUITRY AND METHODS FOR IMPROVING DIFFERENTIAL SIGNALS THAT CROSS POWER DOMAINS

CROSS REFERENCE TO RELATED APPLICATIONS

This application is a continuation of U.S. patent application Ser. No. 12/208,562, filed Sep. 11, 2008, to which priority is claimed and which is incorporated herein by reference in its entirety.

FIELD OF THE INVENTION

Embodiments of the invention relate to improving differential signal integrity when crossing power domains.

BACKGROUND

FIG. 1 illustrates a typical Synchronous Dynamic Random Access Memory (SDRAM) 10, which could include for example a Double Date Rate (DDRx) SDRAM. Specifically shown is a data bus 11 by which data enters and exits the chip. As is typical, this data bus 11 comprises several signals DQ1-DQn which operate in parallel. As is common in SDRAMs, such data is accompanied by a data strobe signal (DQS) which, generally speaking, informs as to the times at which the data can be considered valid. The use of a data strobe signal thus helps to synchronize the data to and from the SDRAM 10.

In some architectures, such as DDR2 or DDR3, the data strobe signal is differential. This means the data strobe (DQS) is always provided with its complement (DQS*), and as such FIG. 1 illustrates two connections on the SDRAM 10 for such complementary signals. As one skilled in the art will appreciate, use of a differential signal improves the overall signal integrity of the data strobe signal.

Also evident in FIG. 1 are external power supply connections to the SDRAM 10. Specifically shown are two sets of power supply voltages: Vdd and Vss; and Vddq and Vssq. Each set is isolated from the other: Vdd is isolated within the SDRAM 10 from Vddq, and likewise for Vss and Vssq. As one skilled in the art will recognize, Vdd and Vddq typically comprises a positive voltage (perhaps 1.5V or so; Vdd and Vddq can however differ from one another), while Vss and Vssq comprise a lower potential which is usually ground (i.e., 0V; again, they can differ). An actual SDRAM 10 would of course have other inputs and outputs as well (e.g., address and control signals), but these are not shown in FIG. 1 because such other signals are not of particular relevance to the subjects discussed herein.

Isolation of the power supply sets allows for each set to power different circuitry blocks within the SDRAM 10. Typically, the Vdd/Vss power supply set powers most of the normal logic circuitry in SDRAM 10, such as the array, decode/driver circuitry, and associated logic. By contrast, the Vddq/Vssq power supply set powers the output driver circuitry 20 at least in part, as shown in FIG. 2. Shown in FIG. 2 are the output paths for the differential data strobe signal (both DQS and DQS*) and the various data output signals (DQ1-DQn), which signals typically terminate at bond pads 13 on the SDRAM 10.

As can be seen, in each of these output paths, up (UP) and down (DN) drive signals are used to drive the bond pads 13 to a particular logic level. When the output paths are outputting signals to the pads 13, the UP and DN drive signals will (in the illustrated example) be the same in a given path. Therefore, to drive DQS high, UP(s)=DN(s)=logic '1.' To drive DQS low, UP(s)=DN(s)=logic '0.' The drive signals UP(s) and DN(s) could however be complementary in other configurations.

(Even though the UP and DN drive signals are disclosed herein as being tied to the same logic level, one skilled in the art will understand that it can still be useful to have these drive signals split so that each can be independently controlled during times when an output is not being driven to the pads 13. For example, independent assertion of UP and DN can be useful during times when the pad is receiving signals to set a proper termination resistance. For further details, see Micron Technical Note DDR3 ZQ Calibration (2008) (http://download.micron.com/pdf/technotes/DDR3/TN4102.pdf), which is submitted in an Information Disclosure Statement filed with this application).

Complements of the drive signals (UP(s)*/DN(s)*) are used to drive DQS* to complementary logic levels. Therefore, to drive DQS* high, UP(s)*=DN(s)*=logic '1.' To drive DQS* low, UP(s)*=DN(s)*=logic '0.'

Because each of the output signals are transferred off of the SDRAM 10, where they will encounter higher capacitances presented by a printed circuit board for example, it is generally preferred to boost the power of the drive signals to ultimately boost the power of the signals generated at the pads 13. Accordingly, each of the drive signals is progressively boosted along their output paths to higher power capacities by a series of stages. In FIG. 2, stages a-e comprise serially-connected CMOS inverters 14, with stages f merely comprising serially-connected pull-up or pull-down transistors. Other types of stages can be used as well. In each successive stage, larger (or wider) transistors are used to increase output current. Thus stage b is larger than stage a; stage c is larger than stage b, etc.

Successive boosting of the power of the drive signals raises the risk of corrupting of the power supply voltages by noise. Accordingly, it is preferred, as shown in FIG. 2, to use two isolated power supply sets, such as the Vdd/Vss and Vddq/Vssq sets. These power supply sets may be unregulated by the SDRAM 10, such that they comprise the externally-asserted supplies discussed earlier with respect to FIG. 1. Or, they may comprise versions of these external supplies internally regulated by the SDRAM 10. In any event, the sets are shown in FIG. 2 and in subsequent figures using the same Vdd/Vss and Vddq/Vssq nomenclature for simplicity, which may comprise either regulated or unregulated supplies.

As shown, the first two stages a and b in the output driver circuitry 20 are powered by the Vdd/Vss power supply set. As mentioned earlier, such power supply set may be used to power the array and logic circuitry in the SDRAM 10. The last stages c-f in the output driver circuitry 20 are powered from the Vddq/Vssq power supply set, which is usually dedicated to the output driving task. Through this use of dual power supply sets, noise present on the Vddq/Vssq power supply set, as might result from the high-current switching of data at the later stages in the output paths, should not be transferred to the Vdd/Vss power supply set feeding the remainder of the circuitry on the SDRAM 10.

This dual power supply set scheme means that the drive signals must pass from one power supply domain (i.e., the Vdd/Vss domain) to another power supply domain (i.e., the Vddq/Vssq domain), which boundary occurs at the dotted line 15 between stages b and c in the example illustrated in FIG. 2.

While the transition of the drive signals between these power supply domains helps to isolate noise between the domains, the decoupling of these two power supply domains has drawbacks. In particular, decoupling the Vddq/Vssq domain from the Vdd/Vss domain renders the Vddq/Vssq domain more susceptible to switching noise than it would be were the entire SDRAM 10 governed by a single, more-heavily-loaded, power domain. As a result, the absolute levels for Vddq/Vssq can more readily shift to higher or lower values in response to such switching noise. Such noise can be heavily dependent on the particular logic levels being output at the bond pads 13 at a given time. For example, the output of all logic '1's on DQ<1:n> creates a particularly power-intensive situations which might load down Vddq, while the output of all logic '0' on DQ<1:n> might similarly increase Vssq. Given the high capacitance between Vddq and Vssq, deviations in one of these power supply voltages will similarly affect the other, such that Vddq and Vssq will tend to vary together while maintaining a constant difference between them. For example, if Vddq ideally equals 1.5V and Vssq ideally equals 0V, noise may cause Vddq to equal 1.4V thus causing Vssq to equal −0.1V. Or, noise may cause Vssq to equal 0.1V thus causing Vddq to equal 1.6 Volts.

It has been noticed by the inventor that such noise-induced perturbations to the Vddq/Vssq power domain relative to the Vdd/Vss power domain have unfortunate effects for the operation of SDRAM 10, and in particular for the integrity of the differential data strobe signal. In particular, it has been noticed that variations in Vddq and Vssq has a negative effect on a particular specification for the differential data strobe signal, referred to as Vox. Fortunately, the inventor has also developed a solution to this problem, as set forth below.

DETAILED DESCRIPTION

Disclosed herein are circuitry and methods for improving differential signals that cross power domains. In an example embodiment, the power supply domain boundary along the output paths that generate the differential signal is staggered, such that the boundary occurs at an odd numbered stage in one differential output path and at an even numbered stage in the other differential output. Defining the power supply domain boundary in this manner can help ensure that the same logical state is present at the boundary in either of the differential output paths. This same logic signal should affect subsequent stages similarly from a speed perspective, and so should similarly affect the differential signals generated by each of the output paths. This means, among other things, that the differential signal as generated should tend to cross nearer to a midpoint voltage, which increases its compliance with certain integrated circuit specifications such as the Vox specification used for the differential data strobe in an SDRAM.

As pointed out earlier, it has been noticed by the inventor that noise-induced perturbations to the Vddq/Vssq power domain relative to the Vdd/Vss power domain have unfortunate effects for the operation of SDRAM 10, and in particular for the integrity of the differential data strobe signal. In particular, it has been noticed that variations in Vddq and Vssq has a negative effect on a particular specification for the differential data strobe signal, referred to as Vox.

Vox comprises the deviation from an otherwise ideal cross-over voltage for the differential data strobe signal. An ideal cross-over voltage for the differential data strobe signals, i.e., DQS and DQS*, is ½ of the voltage between Vddq and Vssq; assuming Vssq is ground, such ideal cross-over point would be ½Vddq, as shown in the top illustration of FIG. 3. In this circumstance, Vox would equal the ideal value of 0.

Figure 1:
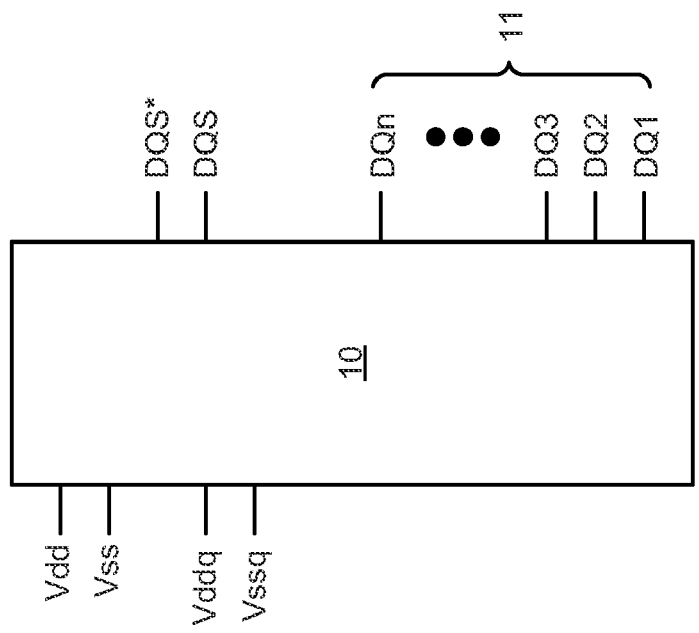
FIG. 1 illustrates some external signals on a SDRAM of relevance to the present disclosure.
Figure 2:
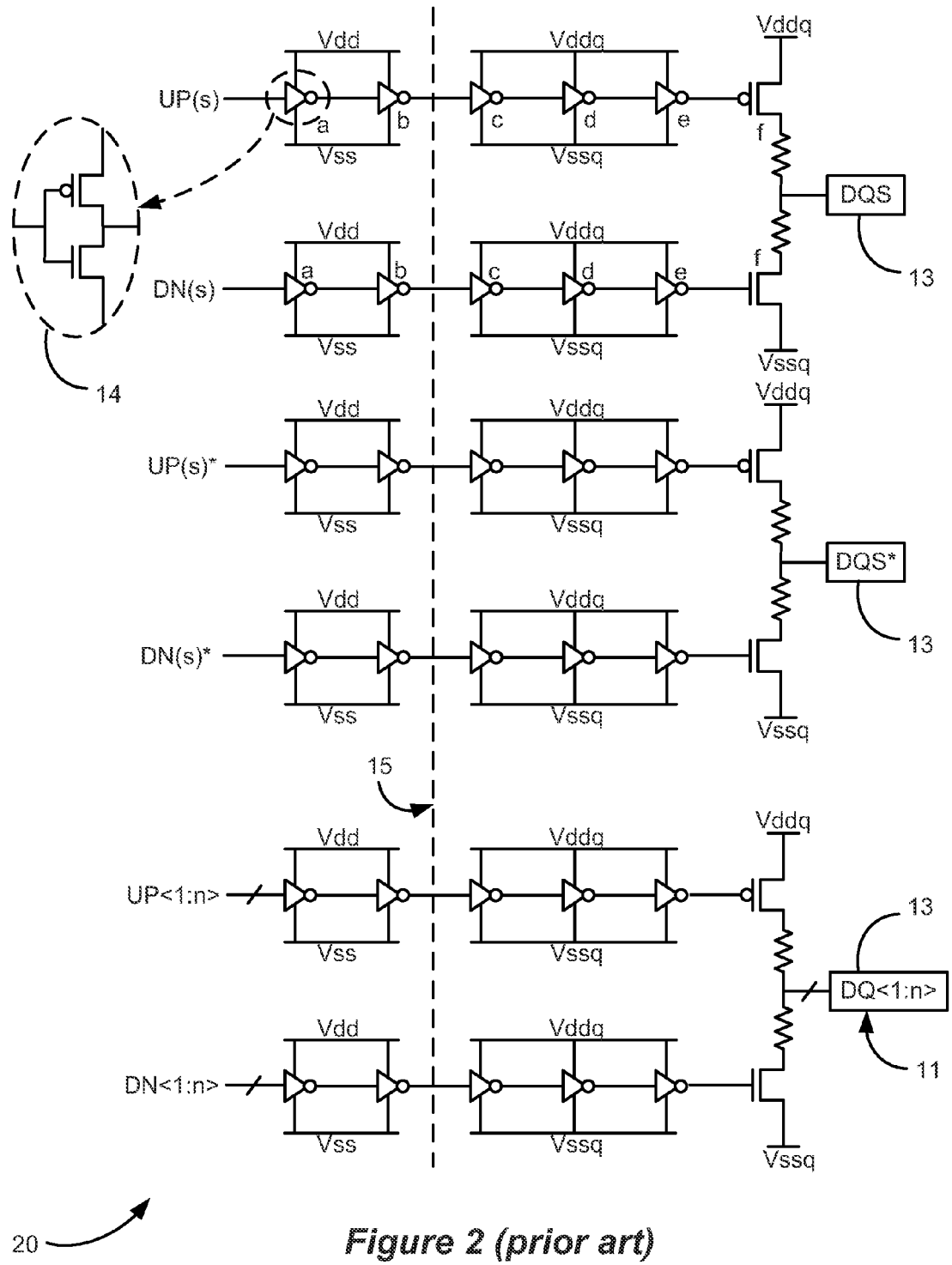
FIG. 2 illustrates the output paths for a differential data strobe signal in an SDRAM, which output paths include a transition across a power supply domain boundary.
Figure 3:
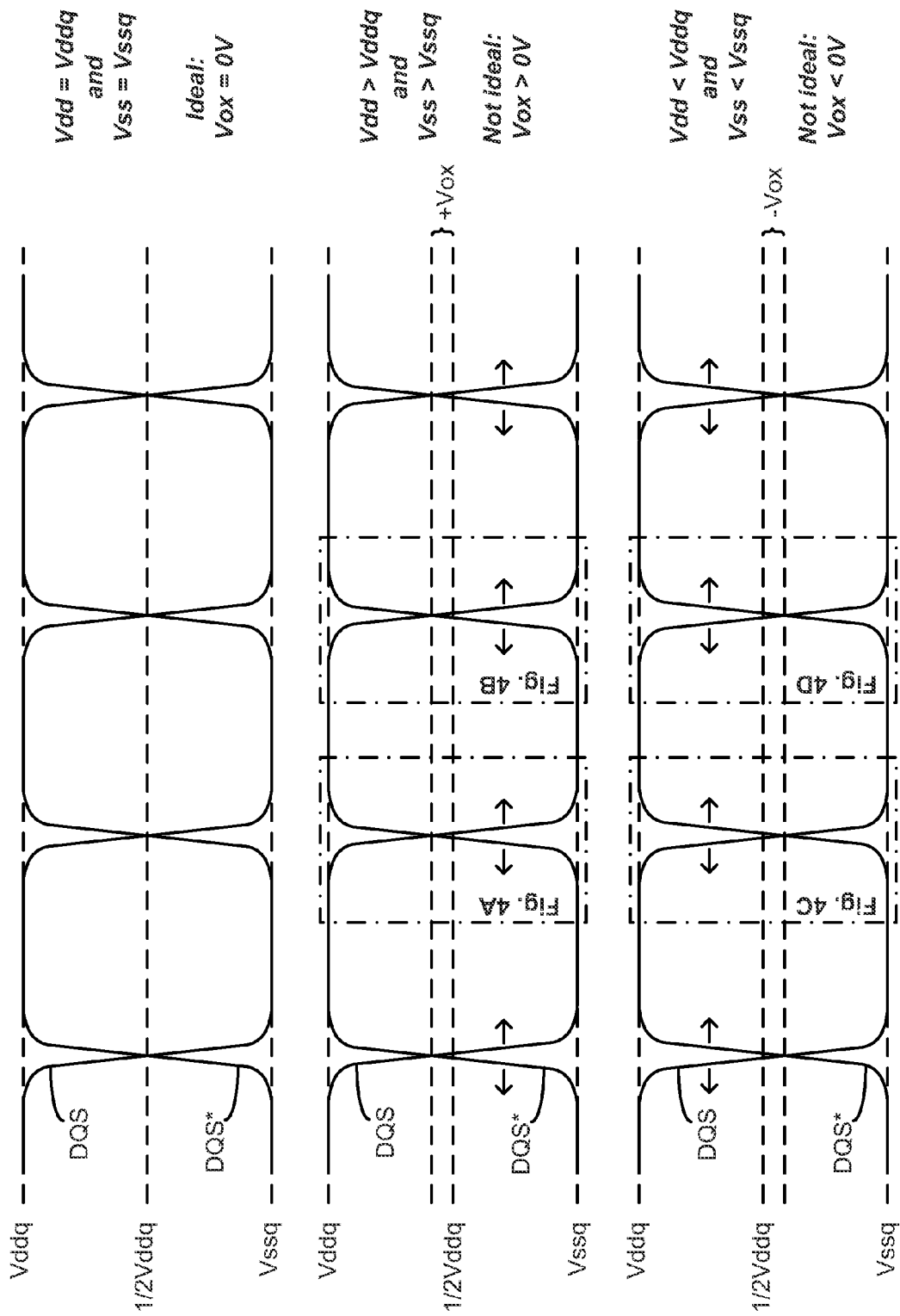
FIGS. 3 and 4A-4D illustrate the negative effect on the Vox specification of the differential data strobe signal resulting from noise-induced fluctuations between the power supply domains of FIG. 2.

However, when Vddq/Vssq drifts relative to Vdd/Vss, Vox is negatively affected, as shown in the bottom two illustrations in FIG. 3. The middle illustration shows the condition when Vddq exceeds Vdd and Vssq exceeds Vss. During this condition, Vox is non-ideal, such that the cross-over point between DQS and DQS* is greater than ½Vddq, i.e., Vox is positive. This occurs both when DQS transitions high, and when DQS transitions low, as shown respectively in FIGS. 4A and 4B.

Figure 4A:
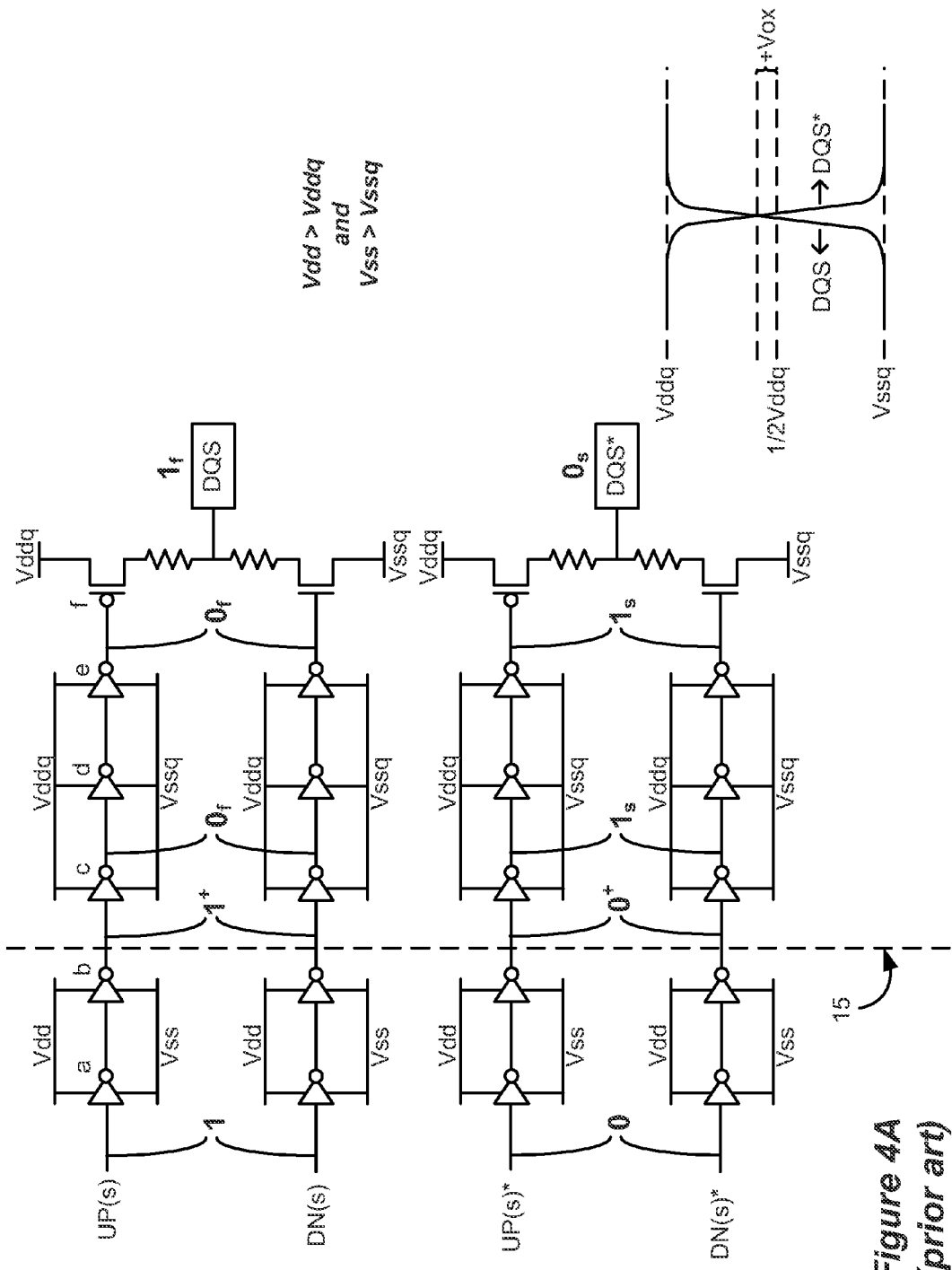

In FIG. 4A, notice that UP(s)=DN(s)=1, which will ultimately cause DQS to likewise be driven to a 1. Concurrently, UP(s)*=DN(s)*=0, which will ultimately cause DQS* to be driven to a 0. Because Vdd>Vddq, and Vss>Vssq, the logic state presented at the domain boundary 15, i.e., that produced by the Vdd/Vss domain, will be relatively large in voltage compared to the new Vddq/Vssq domain it is entering. Such a relatively large voltage is indicated with a + superscript. Therefore, in the DQS path, the logic 1 present at the boundary 15 is denoted $1^+$, while in the DQS* path, the logic 0 present at the boundary is denoted $0^+$. For example, $1^+$ might equal Vdd=1.6V relative to Vddq=1.5V, while $0^+$ might equal Vss=0.1 V relative to Vssq=0V.

Such relatively high voltages for the logic states at the domain boundary 15 have differing effects on the speed in the stages that follow, and in particular results in different speeds in the DQS and DQS* output paths. Consider output path DQS first: the relatively large 1 voltage ($1^+$) in the DQS output path will cause the pull down transistors in the inverters at stages c to act relatively quickly, therefore producing a logic 0 relatively quickly. Therefore, the output from stages c is denoted $0_f$, where the subscript f stands for "fast," meaning that a 0 is produced earlier than it normally would were their no difference in magnitudes between the Vdd/Vss and Vddq/Vssq power domains. This relatively fast 0 propagates through stages d and e, which presents a relatively fast 0 ($0_f$) to the P-channel transistor at stage f, which in turn produces a relatively fast 1 ($1_f$) at the output of DQS.

By contrast, the DQS* output path will operate more slowly. The relatively large 0 voltage ($0^+$) at the boundary 15 in the DQS* output path will cause the pull up transistors in the inverters at stages c to act relatively slowly, therefore producing a logic 1 relatively slowly. Therefore, this output from stages c is denoted $1_s$, where the subscript s stands for "slow," meaning that a 1 is produced later than it normally would were their no difference in magnitudes between the Vdd/Vss and Vddq/Vssq power domains. This relatively slow 1 propagates through stages d and e, which presents a relatively slow 1 ($1_s$) to the N-channel transistor at stage f, which in turn produces a relatively slow 0 ($0_s$) at the output of DQS*.

The effect of the relatively fast DQS signal and the relatively slow DQS* signal can be noticed in the waveforms of FIG. 4A. Because DQS transitions to a 1 quickly, this marches the rising transition for DQS to the left, as denoted by the arrow. Conversely, because DQS* transitions to a 0 relatively slowly, this marches the falling transition for DQS* to the right, again as denoted by the arrow. When these two effect are considered together, it is seen that DQS and DQS* cross at a voltage higher than ½Vddq; in other words Vox is positive (+Vox), which constitutes an unwanted deviation from the ideal. Should this deviation be high enough, the SDRAM 10 could exceed the Vox specification, which could cause failure in any system of which the SDRAM 10 is a part.

Figure 4B:
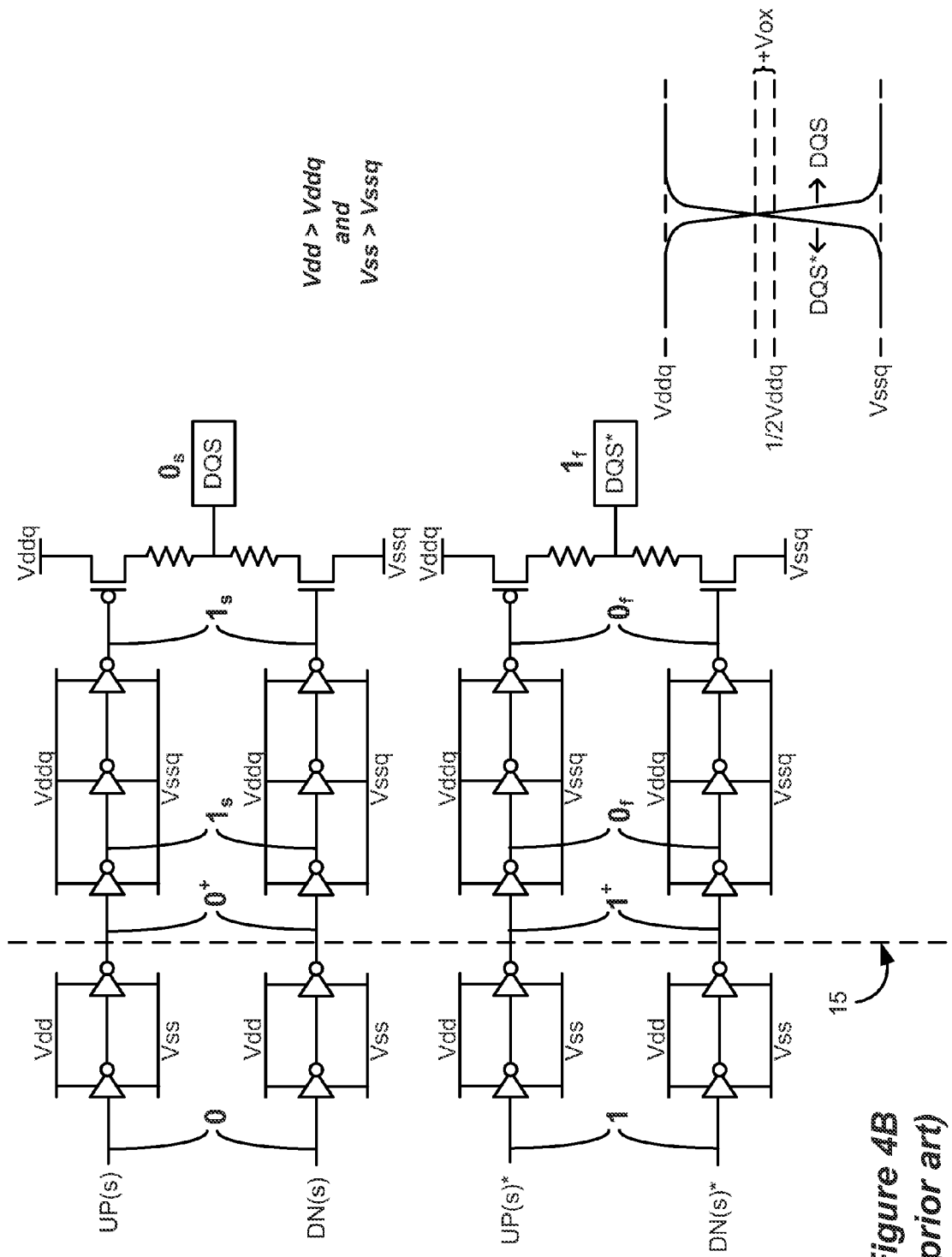

FIG. 4B shows the effect on speed of the generation of the differential data strobe signal under the same conditions as shown in FIG. 4A (Vdd>Vddq and Vss>Vssq), but when DQS is driven to the opposite logic state of 0. Essentially, the analysis is the same as that described for FIG. 4A. However, because of the change in logic state, the output path for DQS is relatively slow, while the output path for DQS* is relatively fast. The effect of the relatively slow DQS signal ($0_s$) and the relatively fast DQS* signal ($1_f$) can be noticed in the waveform in FIG. 4B. Because DQS transitions to a 0 slowly, this marches the falling transition for DQS to the right. Conversely, because DQS* transitions to a 1 relatively quickly, this marches the rising transition for DQS* to the left. These two effects, as with FIG. 4A, cause DQS and DQS* to cross at a voltage higher than ½Vddq, such that Vox is positive and hence non ideal.

To summarize, and referring again to FIG. 3, when Vdd>Vddq and when Vss>Vssq, the effects of driving DQS/DQS* to 1/0 (FIG. 4A) and 0/1 (FIG. 4B) are shown in the middle illustration of FIG. 3. In either case, Vox is positive and non-ideal. Such non-ideality will scale with the difference in absolute values between Vdd and Vddq, and Vss and Vssq.

Figure 4C:
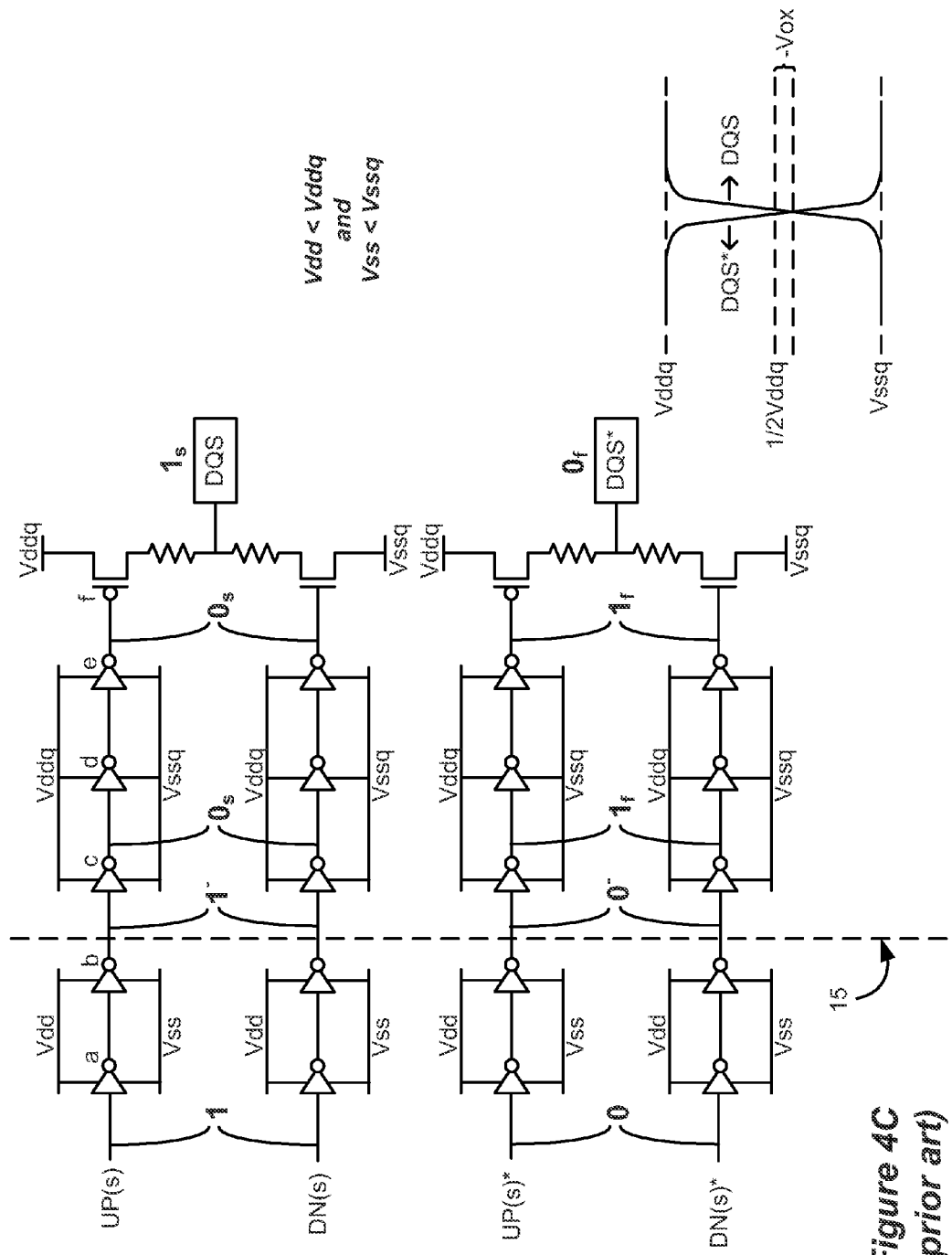
Figure 4D:
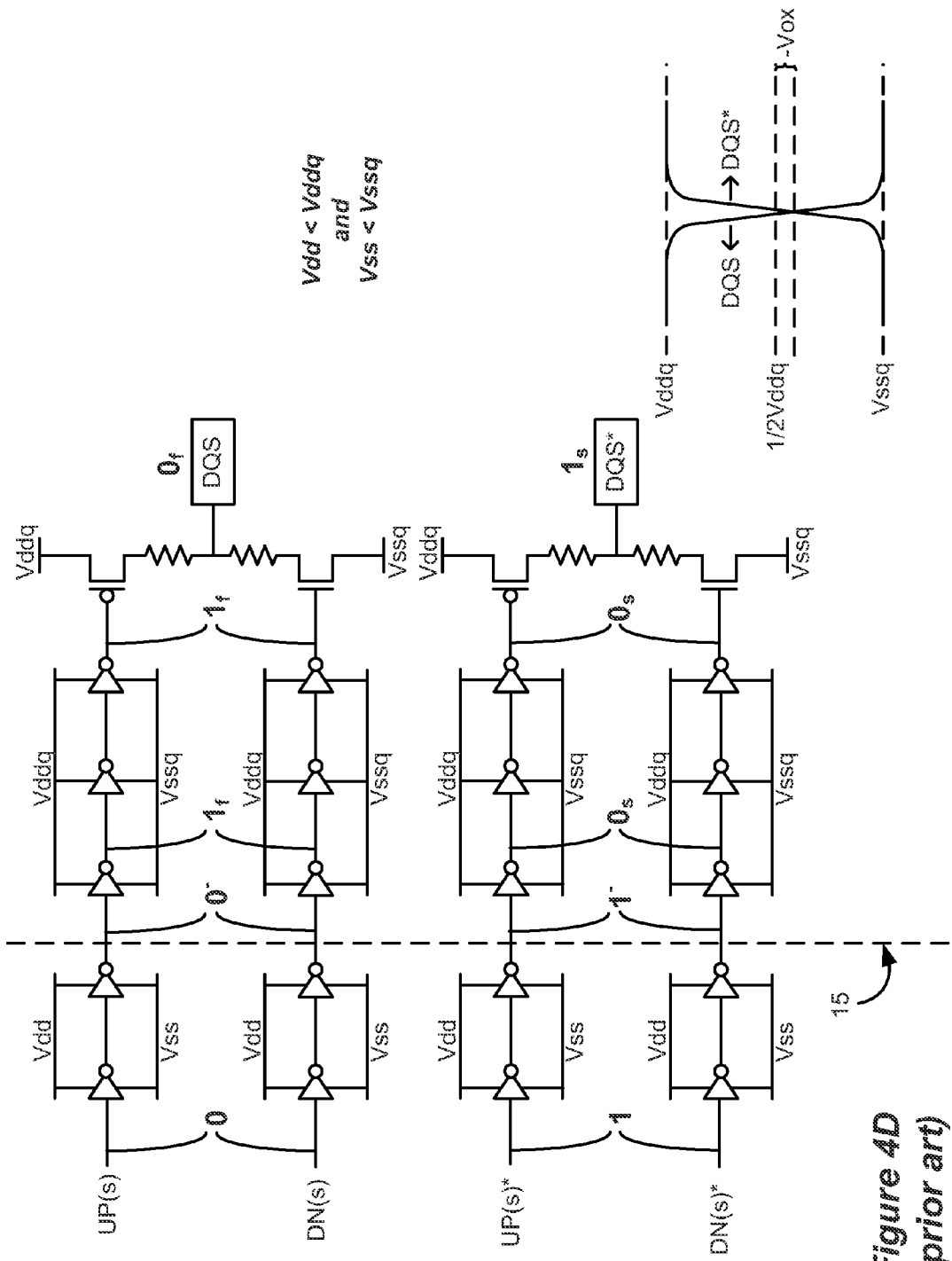

The bottom illustration in FIG. 3 shows the case in which Vdd<Vddq, and Vss<Vssq, and FIGS. 4C and 4D, like FIGS. 4A and 4B, shows generation of alternative logic states for DQS. FIG. 4C shows the generation of a logic 1 for DQS. Accordingly, UP(s)=DN(s)=1 as is necessary to generate DQS=1, and concurrently UP(s)*=DN(s)*=0 as is necessary to generate DQS*=0. Because Vdd<Vddq, and Vss<Vssq, the logic state presented at the domain boundary 15, i.e., that produced by the Vdd/Vss domain, will be relatively low in voltage compared to the new Vddq/Vssq domain it is entering. Such a relatively low voltage is indicated with a – superscript. Therefore, in the DQS path, the logic 1 present at the boundary 15 is denoted $1^-$, while in the DQS* path, the logic 0 present at the boundary is denoted $0^-$. For example, V might equal Vdd=1.4V relative to Vddq=1.5V, while $0^-$ might equal Vss=–0.1 V relative to Vssq=0V.

Such relatively low voltages for the logic states at the domain boundary 15, like the relatively high voltages discussed in FIGS. 4A and 4B, have differing effects on the speed in the DQS and DQS* output paths, as shown in FIGS. 4C and 4D. Consider output path DQS first as illustrated in FIG. 4C: the relatively low 1 voltage ($1^-$) in the DQS output path will cause the pull down transistors in the inverters at stages c to act relatively slowly, therefore producing a logic 0 relatively slowly. Therefore, the output from stages c is denoted $0_s$. This relatively slow 0 propagates through stages d and e, which presents a relatively slow 0 ($0_s$) to the P-channel transistor at stage f, which in turn produces a relatively slow 1 ($1_s$) at DQS.

By contrast, the DQS* output path of FIG. 4C will operate more quickly. The relatively low 0 voltage ($0^-$) in the DQS* output path will cause the pull up transistors in the inverters at stages c to act relatively quickly, therefore producing a logic 1 relatively quickly ($1_f$). This relatively fast 1 propagates through stages d and e, which presents a relatively fast 1 to the N-channel transistor at stage f, which in turn produces a relatively fast ($0_f$) at the output of DQS*.

The effect of the relatively slow DQS signal and the relatively fast DQS* signal can be noticed in the waveform in FIG. 4C. Because DQS transitions to a 1 slowly, this marches the rising transition for DQS to the right. Conversely, because DQS* transitions to a 0 relatively quickly, this marches the falling transition for DQS* to the left. When these two effects are considered together, it is seen that DQS and DQS* cross at a voltage lower than ½Vddq; in other words Vox is negative (–Vox), which constitutes a deviation from the ideal. Should this deviation be high enough, the SDRAM 10 could exceed the Vox specification with negative results.

FIG. 4D shows the effect on speed of the generation of the differential data strobe signal under the same conditions as shown in FIG. 4C (Vdd<Vddq and Vss<Vssq), but when DQS is driven to the opposite logic state of 0. Essentially, the analysis is the same as that described for FIG. 4C. However, because of the change in logic state, the output path for DQS is relatively fast, while the output path for DQS* is relatively slow. The effect of the relatively fast DQS signal ($0_f$) and the relatively slow DQS* signal ($1_s$) can be noticed in the waveform in FIG. 4D. Because DQS transitions to a 0 quickly, this marches the falling transition for DQS to the left. Conversely, because DQS* transitions to a 1 relatively slowly, this marches the rising transition for DQS* to the right. These two effects cause DQS and DQS* to cross at a voltage lower than ½Vddq, such that Vox is negative and hence non ideal.

To summarize, and referring again to FIG. 3, when Vdd<Vddq and when Vss<Vssq, the effects driving DQS/DQS* to 1/0 (FIG. 4C) and 0/1 (FIG. 4D) are shown in the bottom illustration of FIG. 3. In either case, Vox is negative and is therefore non-ideal. Again, such non-ideality will scale with the difference in absolute values between Vdd and Vddq, and Vss and Vssq.

FIGS. 3-4D thus illustrates that switching noise that might cause deviations in the absolute values between Vss/Vdd and Vddq/Vssq domains can cause unwanted deviations in Vox. If such deviations are significant, the SDRAM 10 might fail to qualify as a reliable integrated circuit.

Figure 5:
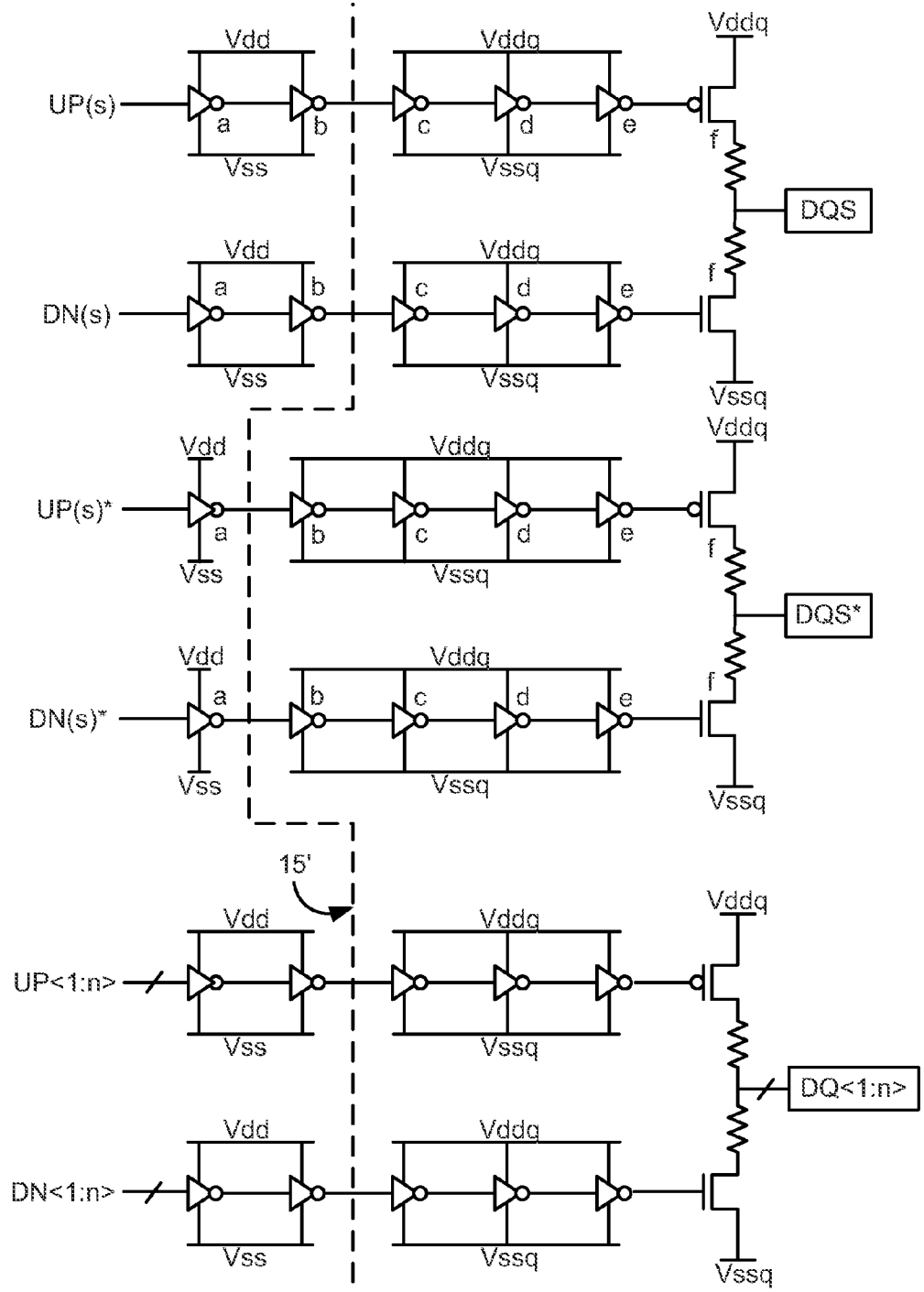
FIG. 5 illustrates the output paths for a differential data strobe signal in an SDRAM in accordance with an embodiment of the disclosed technique, which output paths include a transition across a power supply domain boundary that occurs between different stages in the two differential output paths.
Figure 6:
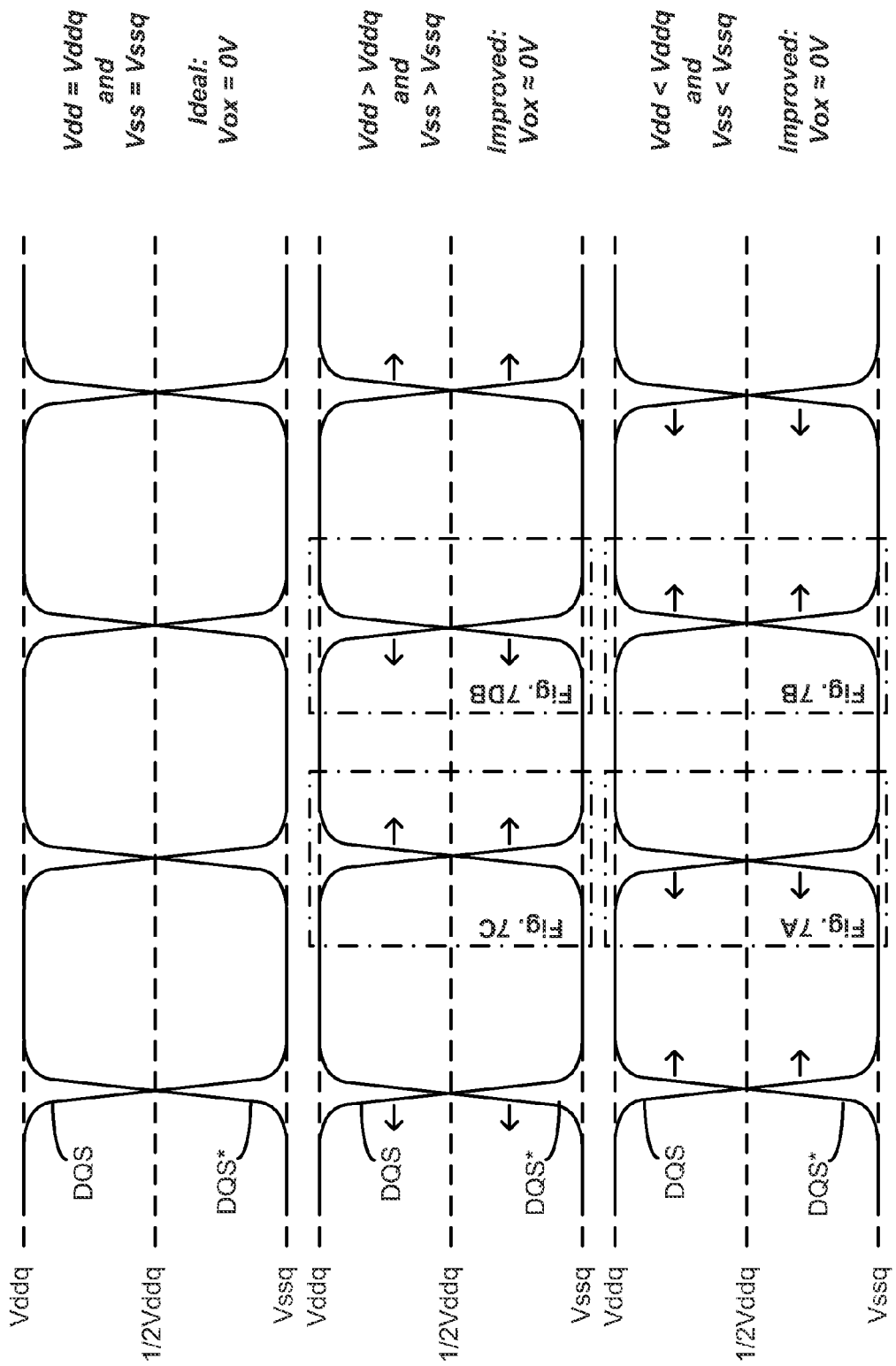
FIGS. 6 and 7A-7D illustrate the improved effect on the Vox specification of the differential data strobe signal resulting from noise-induced fluctuations between the power supply domains of FIG. 5.

A solution to this problem is illustrated in FIGS. 5 through 7. As shown in FIG. 5, one technique comprises defining the boundary 15 between the Vdd/Vss power supply domain and the Vddq/Vssq power supply domain at different stages in the output paths for the differential data strobe signal, i.e., at different stages in the DQS output path and the DQS* output path. Thus, in the example shown in FIG. 5, the power supply domain boundary occurs between stages b and c in the DQS output path, but between stages a and b in the DQS* output path.

Figure 7A:
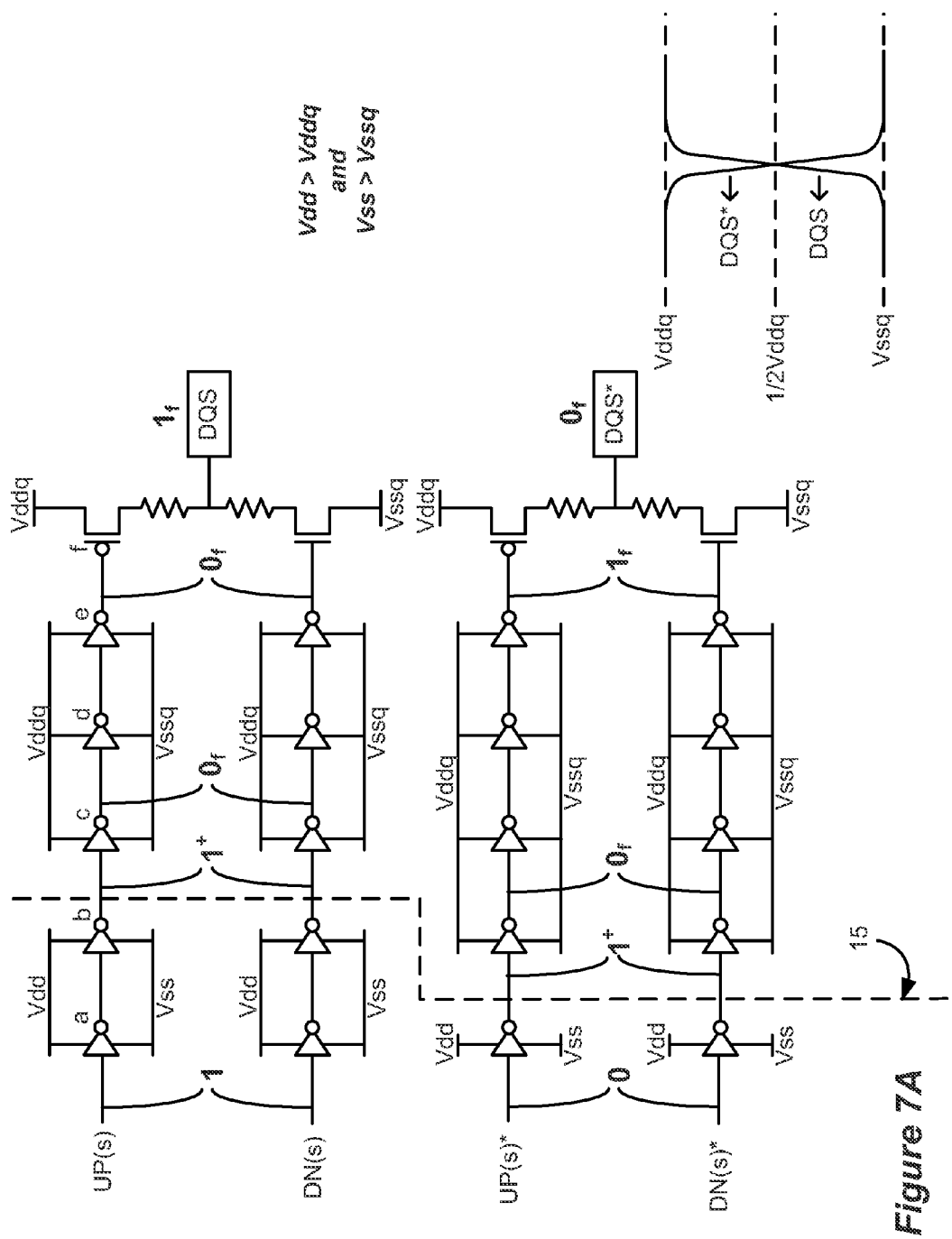
Figure 7B:
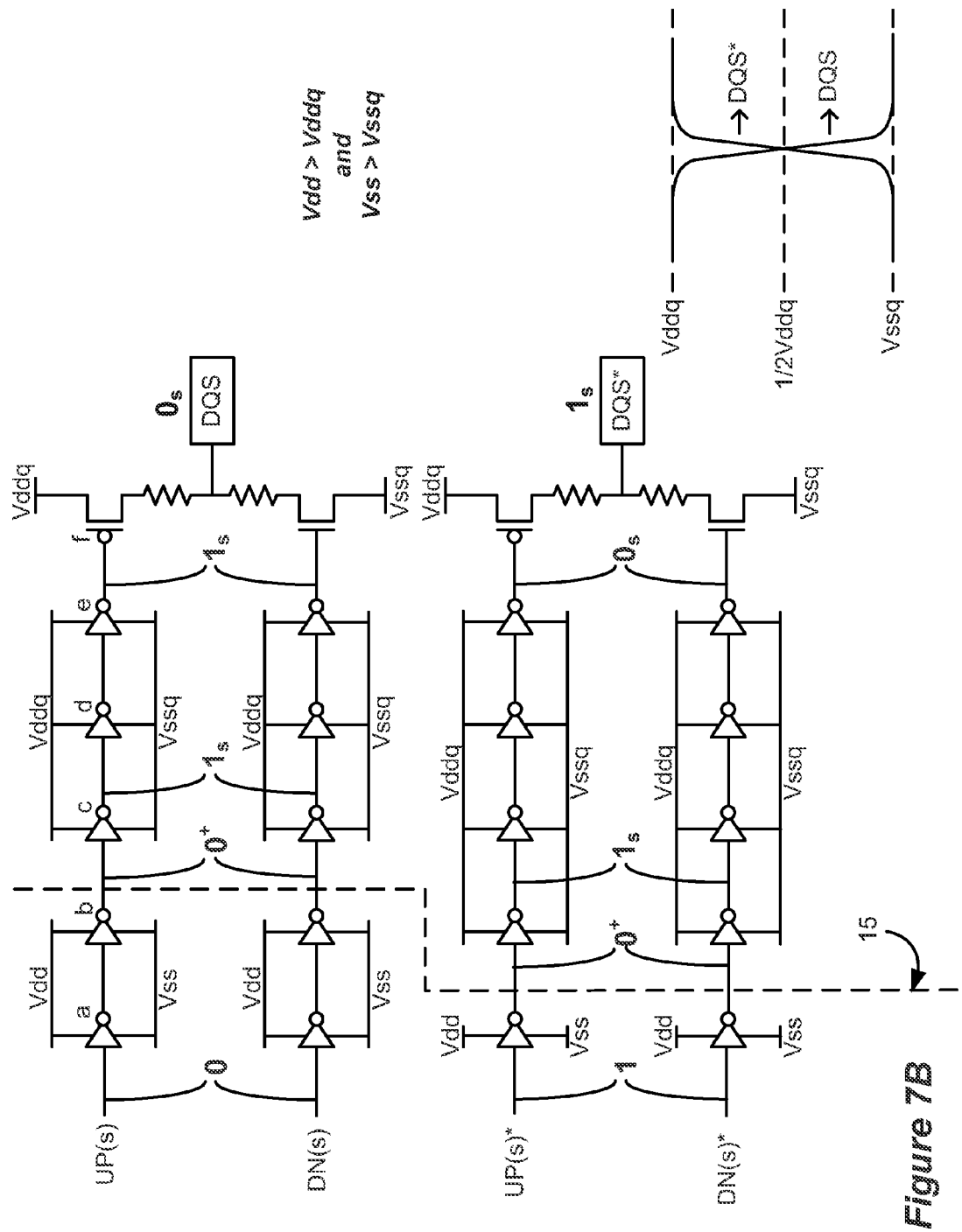
Figure 7C:
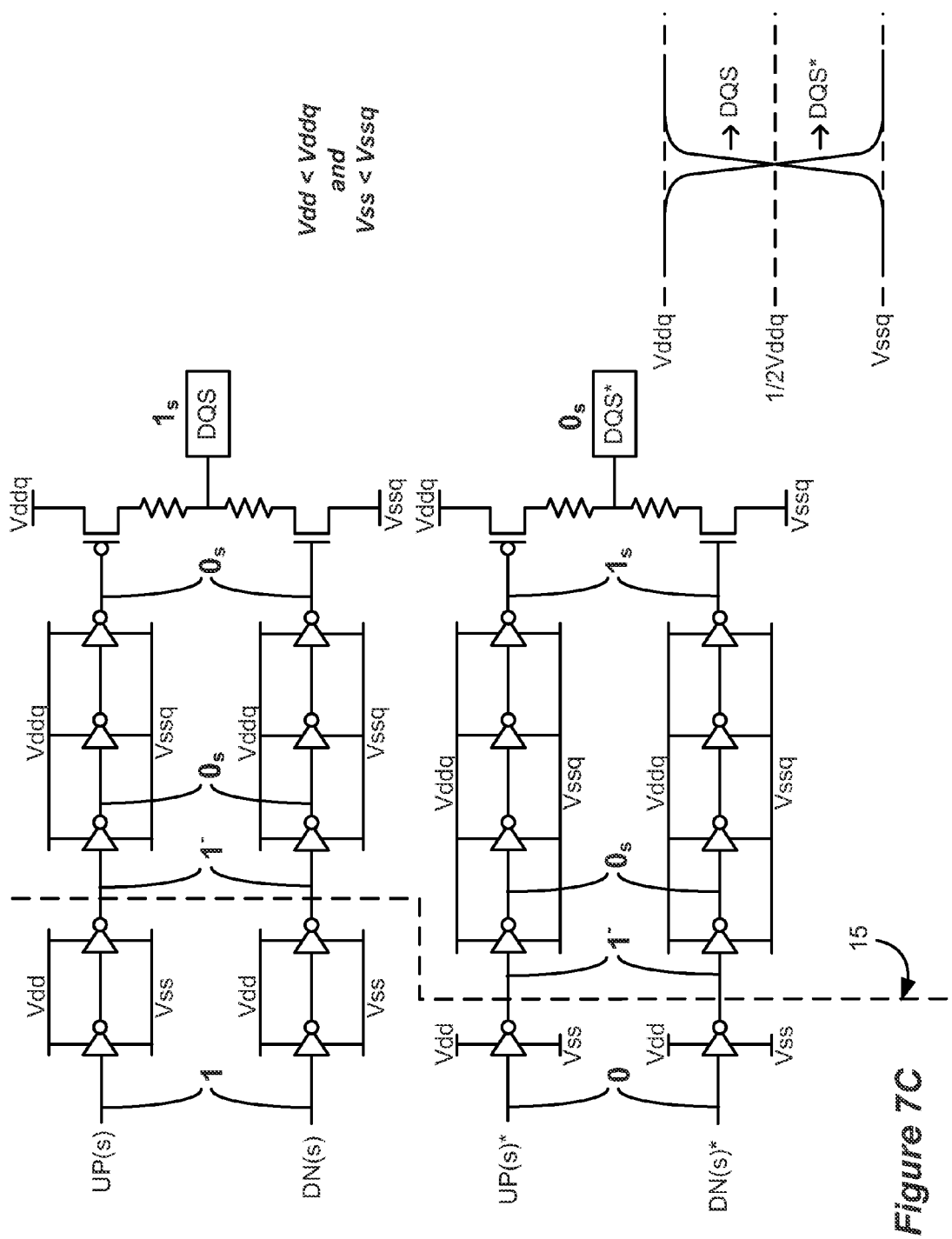
Figure 7D:
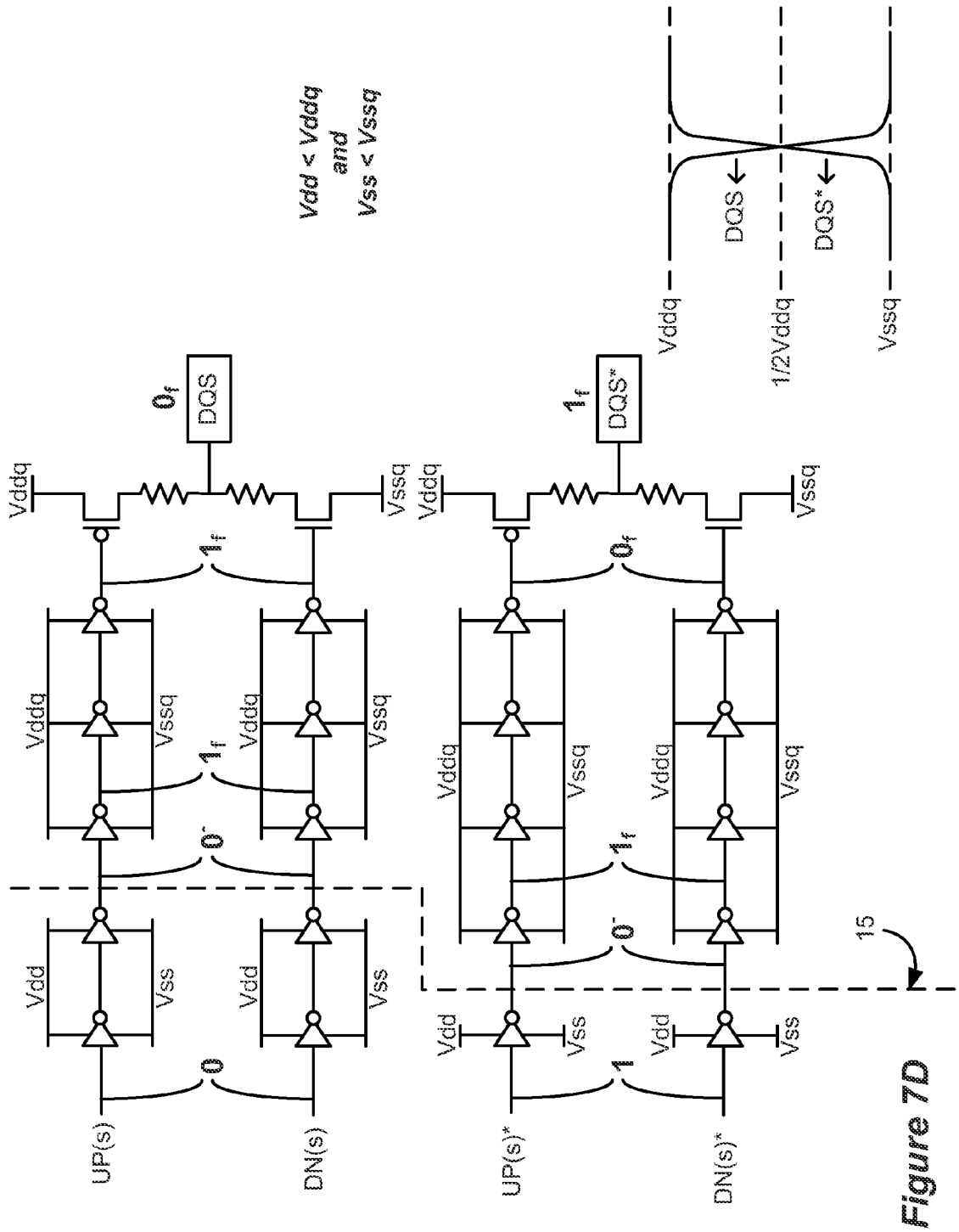

Defining the power supply domains in this manner tends to equate the relative speed in the output paths for DQS and DQS*, which diminishes Vox deviations. This is illustrated in FIGS. 6 and 7A-7D. FIGS. 7A-7D are analogous to the conditions illustrated earlier in FIGS. 4A-4D in connection with the prior art. Thus, FIGS. 7A and 7B present the situation where Vdd>Vddq and Vss>Vssq for DQS=1 (FIG. 7A) and DQS=0 (FIG. 7B). FIGS. 7C and 7D present the situation where Vdd<Vddq and Vss<Vssq for DQS=1 (FIG. 7C) and DQS=0 (FIG. 7D). Analysis of each of these conditions shows speed equalization in the output paths for DQS and DQS*, which improves Vox and brings it closer to its ideal value of zero.

When Vdd>Vddq and Vss>Vssq, logic states presented at the domain boundary 15 will be relatively high, i.e., $1^+$ and $0^+$. FIGS. 4A and 4B illustrate that these relatively-high logic states will react with different speeds in the Vddq/Vssq domain, with $1^+$ acting relatively quickly, and $0^+$ acting relatively slowly. However, when defining the domain boundary 15 as shown in FIGS. 7A and 7B, it is seen that the same logic state is present at the boundary, with $1^+$ present in FIG. 7A, and $0^+$ present in FIG. 7B. This logic state affect the next stages in the output paths (i.e., stages c in the DQS path; stages b in the DQS* path) with equal speed.

Thus, in FIG. 7A a fast 0 ($0_f$) is produced by these stages in both the DQS and the DQS* output paths. These relatively fast logic values then propagate through the remaining stages to produce a relatively fast 1 ($1_f$) at DQS and a relatively fast 0 ($0_f$) at DQS*. Because both of these data strobe signals are relatively fast, it is seen in the waveform diagram that both transitions in the data are moved to the left. Because both move together, their cross-over point is reasonably maintained, such that Vox remains closer to its ideal value of zero.

In FIG. 7B, a slow 1 ($1_s$) is produced by the first stages in the Vddq/Vssq domains in both the DQS (stage c) and the DQS* (stage b) output paths. These relatively slow logic values then propagate through the remaining stages to produce a relatively slow 0 ($0_s$) at DQS and a relatively slow 1 ($1_s$) at DQS*. Because both of these data strobe signals are relatively slow, it is seen in the waveform diagram that both transition in the data are moved to the right. This is different than in FIG. 7A, when both transitions moved to the left. Regardless, because both transitions move together, their cross-over point is again reasonably maintained, such that Vox remains closer to its ideal value of zero.

In FIGS. 7C and 7D, when Vdd<Vddq and Vss<Vssq, both logic states presented at the domain boundary 15 will be relatively low, i.e., $1^-$ and $0^-$. FIGS. 4C and 4D teach that these relatively-low logic states will react with different speeds in the new Vddq/Vssq domain, with $1^-$ acting relatively slowly, and $0^-$ acting relatively quickly. However, when defining the domain boundary 15 as shown in FIGS. 7C and 7D, it is seen that the same logic state is present at the boundary, with $1^-$ present in FIG. 7C, and $0^-$ present in FIG. 7C. These logic states affect the next stages in the output paths (i.e., stages c in the DQS path; stages b in the DQS* path) with equal speed. Thus, it is seen in FIG. 7C that both DQS and DQS* are produced relatively slowly, while in FIG. 7D both are produced relatively quickly. In each case, this same relative speed adjustment assists in keeping Vox to a minimum.

The overall effect for each of the conditions of FIGS. 7A-7D can be seen in FIG. 6. To reiterate points made above with respect to FIGS. 7A-7D, both the rising and falling edges of the differential data strobe signal tends to move in the same direction, either as slightly faster signals or slightly slower signals. Because the edges of DQS and DQS* move in the same relative direction at each transition, Vox tends to stay closer to the ideal value of 0. By comparison, in the prior art (FIG. 3), the edges of DQS and DQS* moved in different directions at each transition, with one signal being fast while the other was slow. This caused deviation in the cross over point, which led to higher absolute values for Vox.

While the speed of the stages in the DQS and DQS* output paths are brought closer in accordance with the disclose technique, it should be appreciated that speeds in those output paths may not be exactly equated. Consider FIG. 7A for example. Because the power supply domain boundary 15 is located between different stages in the DQS and DQS* output paths, the speeds will vary slightly between the two paths. Specifically, the signal $1^+$ will travel more quickly through stage b in the DQS* output path than will the 0 signal travel thought stage b in the DQS output path. As these signals propagate through the remaining stages, the result is that the DQS* output path operates slightly more quickly. However, such slight variations are not believed to be significant, and certainly are much less significant than the timing differences between the DQS and DQS* output paths in the prior art.

While developed in the context of improving the Vox specification for a differential data strobe signal in a DDR SDRAM, it should be appreciated that the disclosed technique can be applied to, for example, improve the integrity of any differential signal which must cross at least one power domain, which differential signal may comprise a clocking signal, a control signal, a data signal, or any other type of differential signal.

Figure 8:
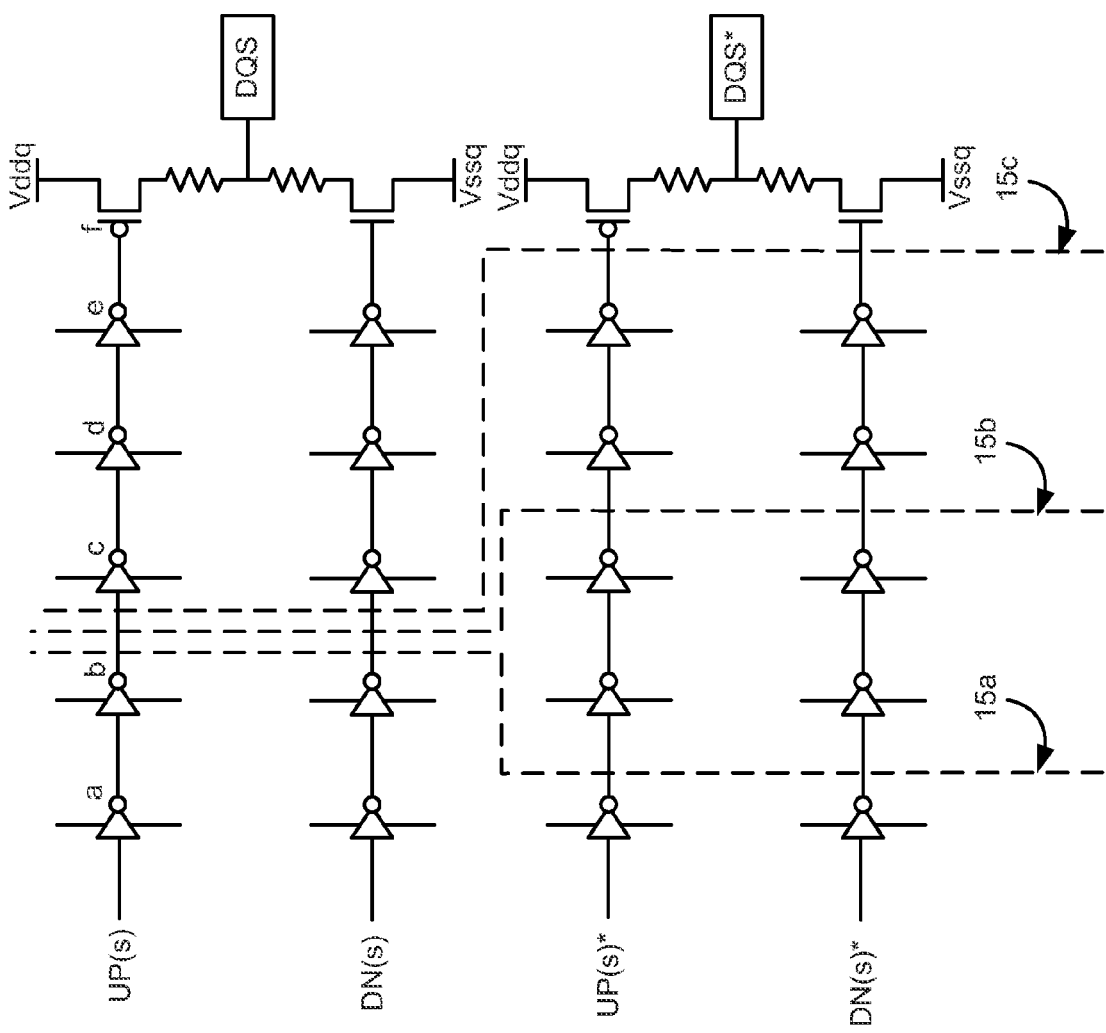
FIG. 8 illustrates different positions for the power supply domain boundary in the two differential output paths in accordance with variations of the disclosed technique.

Modifications to the disclosed technique are possible. For example, the domain boundary 15 can cross in different places in the two differential output paths. As shown in FIG. 8, any of the domain boundaries 15a (FIG. 5), 15b, or 15c will affect the benefits of the disclosure because in each case the logic state is the same at the boundary in each differential path. Because a differential signal is involved, notice that this means that the difference in the boundary 15 in the two differential output paths varies generally by 2N+1 stages (i.e., −3, −1, 1, 3, etc.). Thus, the Vdd/Vss domain can power a first X of the stages in the DQS or DQS* output path, and a first X+1 of the stages in the other of the DQS or DQS* output path; or, Vdd/Vss can power an odd number of the stages in the DQS or DQS* path, and an even number of stages in the other of the DQS or DQS* output path. In either event; the Vddq/Vssq domain can power the remaining of the stages.

Figure 9:
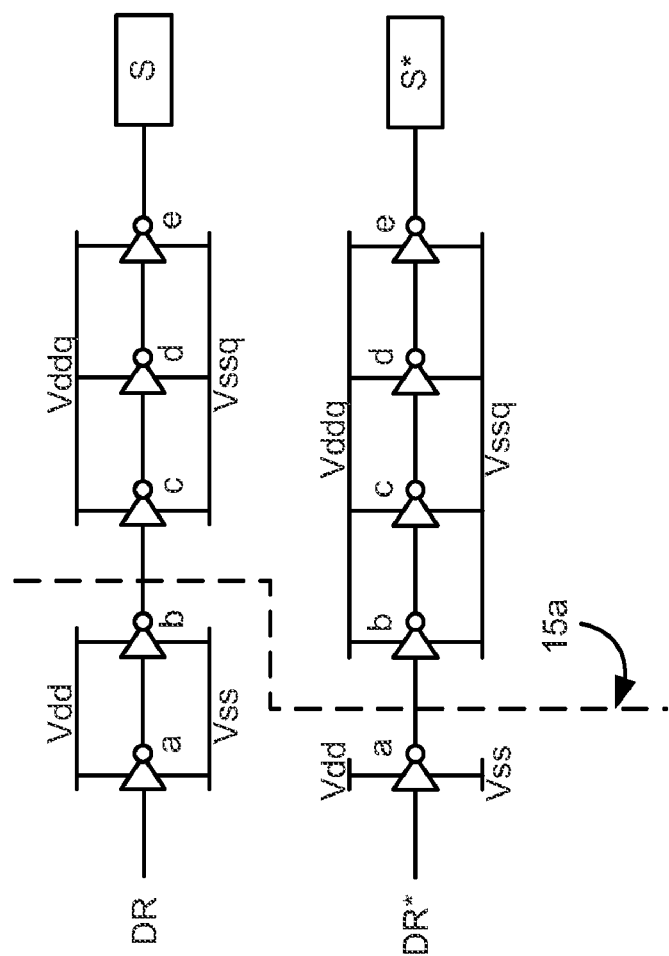
FIG. 9 illustrates an application of the disclosed technique used with simpler differential output paths each having only a single drive signal.

It should also be noted that use of dual drive signals (UP and DN) in each differential output path is not strictly required. For example, FIG. 9 illustrates a simpler differential output path than the DDR SDRAM-based differential data strobe output that has been illustrated to this point. In FIG. 9, the output stages a-e merely comprise inverters (they could comprise other types of stages as well), and there is only one drive signal per output path, i.e., DR and DR*, which are used to generate a generic differential signal, S and S*. Because the signal at the domain boundary 15 would always equal DR, subsequent stages (c-e for output path S; b-e for output path) would generally act relatively quickly or slowly depending on the relationship between Vdd and Vddq and Vss and Vssq.

In the embodiments illustrated to this point, is has been assumed that Vdd roughly equals Vddq and Vss roughly equals Vssq, such that the potential difference between the two supply voltages in each power supply domain is essentially the same. However, this is not strictly necessary, and the disclosed technique has applicability when a signal transfers through a power supply domain boundary that modifies signal magnitudes.

Figure 10:
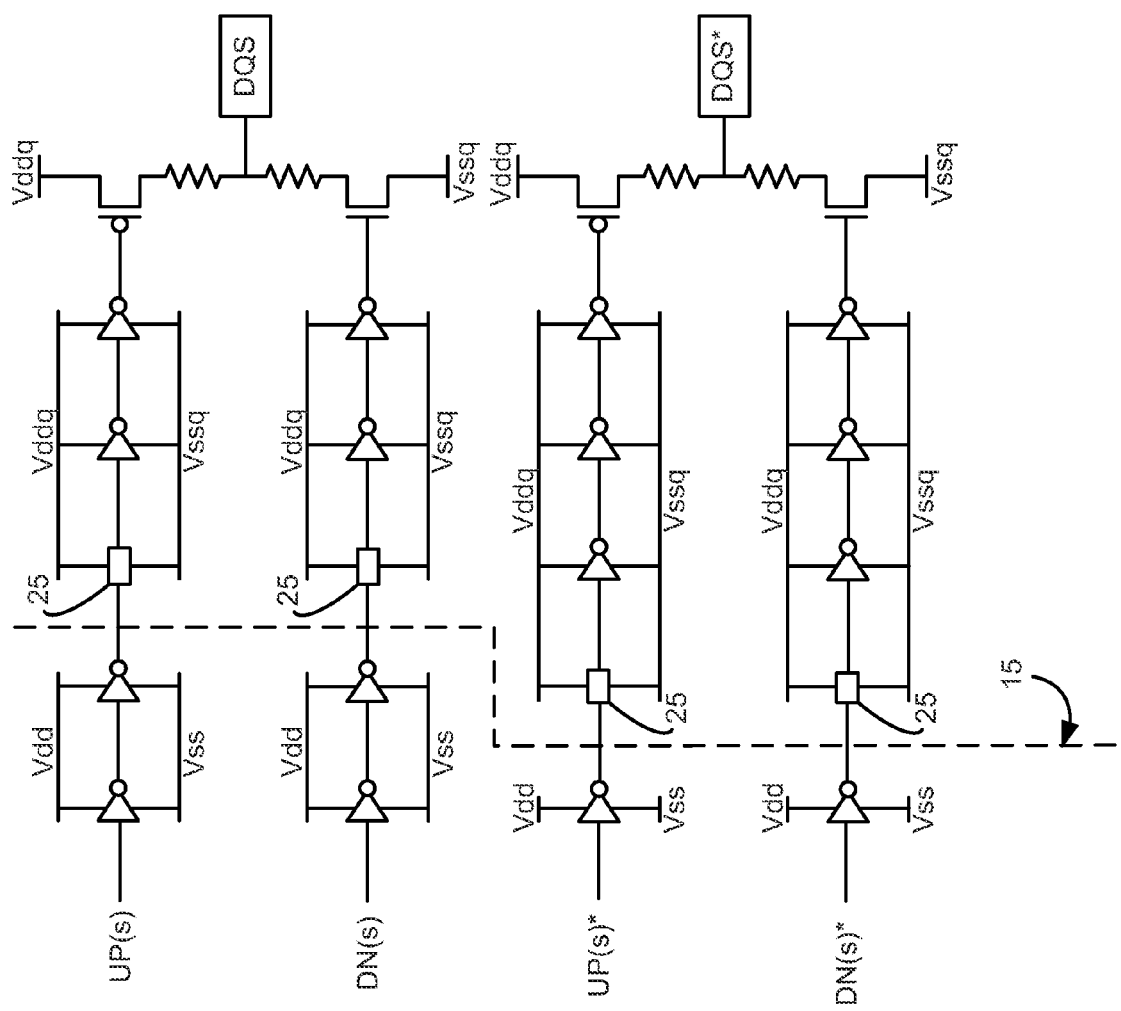
FIG. 10 illustrates application of the disclosed technique to differential output paths having level translators.

For example, the SDRAM 10 or other integrated circuit in which the disclosed technique is embodied may run a smaller power supply internal to the device (e.g., Vdd=1.5V) than is specified outside of the device (e.g., Vddq=2.5V). In such an application, one could modify the drive signal at some point in the differential output paths by a level translator stage 25, as shown in FIG. 10. The level translator stages 25 modify the input signal from Vdd/Vss to Vddq/Vssq, e.g., from a first potential difference to a second potential difference. For example, an incoming logic 1 of Vdd (e.g., 1.5V) is translated by the level translator 25 to a logic 1 of Vddq (e.g., 2.5V). The level translators 25 likewise translate an incoming logic 0 of Vss (e.g., 0V) to Vssq (which again may be different, but which may also equal 0V). Alternatively, and depending on the circuitry used for the level translator 25, the output of the level translator 25 could comprise an inverted output, although the level translators 25 shown in FIG. 10 are illustrated as non-inverting. If it is inverting, an incoming logic 1 of Vdd (e.g., 1.5V) is translated to a logic 0 of Vssq (e.g., 0V), and an incoming logic 0 of Vss (e.g., 0V, but which could be different from Vssq) is translated to a logic 1 of Vddq (e.g., 2.5V). The circuitry for such level translators 25 are well known, and any number of such circuits could be used for this purpose; hence such circuitry is not disclosed here.

The level translators 25 as illustrated in FIG. 10 can be viewed as being in the Vddq/Vssq power domain, because such circuitry has a connection to the Vddq and Vssq power supply voltages. This defines a domain boundary 15 as in earlier embodiments. If more complex circuitry is used for the level translators 25, such circuitry may additionally have connection to the Vdd/Vss power supplies as well as to the Vddq/Vssq power supplies. In such a case (not illustrated), the power supply domain boundary 15 can be viewed as occurring in the middle of the stage 25.

In any event, placement of the level translators 25 at different stages in the output paths for the differential data strobe signal creates the same staggered boundary 15 as noted earlier. This staggered boundary 15 has the same benefits, even though the magnitude of the signals changes by virtue of the level translators 25. Consider for example, if the Vddq and Vssq power supplies FIG. 10 are lower than their optimal values, possibly because of switching noise in the output paths. For example, Vddq might equal 2.4V (instead of a normal 2.5V) and Vssq might equal −0.1V (instead of a normal 0V). In such a case, the logic states presented at the power supply domain boundary 15 are relatively high, and are of the same value by virtue of the staggered boundary. This means that the output of the next stage (i.e., the level translators 25) will react with similar speed, even though magnitude translation is being performed at that stage. The result, as in earlier embodiments, is the same relative shift in the speed in subsequent stages in both output paths, and ultimately the same relative degree of speed shift in the differential outputs (e.g., DQS, DQS*). As before, adjustment of the speed of both outputs in unison helps to keep Vox for the differential output closer to its optimal value of zero.

In the context of the disclosed technique, two different power supply sets or domains can comprise one power supply voltage in common to both sets or domains. For example, a first power supply set or domain could comprise Vdd and Vss, while the second power supply set or domain could comprise Vddq and Vss, where Vddq is isolated from Vdd, and/or Vddq is possibly of a different voltage than Vdd.

While certain embodiments of the invention have been disclosed, it should be understood that other embodiments can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. Circuitry for forming a differential signal comprising a first signal and a second signal, comprising:
    a first path comprising a plurality of first stages configured to produce a first signal at a first node;
    a second path comprising a plurality of second stages configured to produce a second signal at a second node, wherein the second signal comprises the complement of the first signal;
    a first power supply domain for powering at least some of the first and second stages, wherein the first power supply domain powers a different number of the first stages than the second stages; and
    a second power supply domain for powering the first and second stages that are not powered by the first power supply domain.

2. The circuitry of claim 1, wherein the plurality first stages are serially connected, and wherein the plurality of second stages are serially connected.

3. The circuitry of claim 1, wherein the first power supply domain defines a first potential difference, and wherein the second power supply domain defines a second potential difference different from the first potential difference.

4. The circuitry of claim 1, wherein the first power supply domain defines a potential difference, and wherein the second power supply domain defines the same potential difference.

5. The circuitry of claim 1, wherein the first path is driven by at least one first drive signal and wherein the second path is driven by at least one second drive signal.

6. The circuitry of claim 5, wherein the first path is driven by two first drive signals, and wherein the second path is driven by two second drive signals.

7. The circuitry of claim 6, wherein the two drive signals in each path are independently controllable.

8. The circuitry of claim 6 wherein the two drive signals in each path are complementary.

9. The circuitry of claim 5, wherein the first path is driven by one first drive signal, and wherein the second path is driven by one second drive signal.

10. The circuitry of claim 9, wherein the first and second drive signals are complementary.

11. The circuitry of claim 1, wherein the first and second nodes comprise bond pads on an integrated circuit.

12. The circuitry of claim 1, wherein at least one stage in each of the first and second output paths comprises a level translator.

13. The circuitry of claim 1, further comprising at least one data output.

14. The circuitry of claim 13, wherein the first and second signals comprise a differential data strobe signal for synchronizing the at least one data output.

15. The circuitry of claim 14, wherein there are a plurality of data outputs each at a bond pad, and wherein the first and second differential data strobe signals are each at a bond pad.

16. The circuitry of claim 1, wherein there are N first stages and N second stages, wherein N is an integer.

17. The circuitry of claim 16, wherein the first power supply domain powers an odd number of first stages, and an even number of second stages.

18. The circuitry of claim 16, wherein the first power supply domain powers X first stages, and X+1 second stages, and wherein the second power supply domain powers N−X of the first stages, and N−X−1 of the second stages; wherein X is an integer, and N−X is greater than or equal to 2.

19. The circuitry of claim 16, wherein a last of the first stages and a last of the second stages comprises serially-connected pull up and pull down transistors, and wherein the first and second signals are formed between the pull up and pull down transistors.

20. The circuitry of claim 1, wherein at least one of the first stages and at least one of the second stages comprise inverters.

21. Circuitry for forming a differential signal comprising a first output signal and a second output signal, comprising:
- a first path comprising a plurality of serially-connected first stages configured to produce a first output signal at a first node;
- a second path comprising a plurality of serially-connected second stages configured to produce a second output signal at a second node, wherein the second output signal comprises the complement of the first output signal;
- a power supply boundary separating a first power supply voltage and a second power supply voltage in the first and second paths, wherein the first and second power supply voltages are isolated from each other; and
- at least one first drive signal appearing at the power supply boundary in the first path, and at least one second drive signal appearing at the power supply boundary in the second path, wherein the at least one first drive signal is or are of the same logic state as the at least one second drive signal.

22. The circuitry of claim 21, wherein there is one first drive signal and one second drive signal appearing at the power supply boundary.

23. The circuitry of claim 21, wherein there are two first drive signals and two second drive signals appearing at the power supply boundary.

24. The circuitry of claim 21, wherein the first and second nodes comprise bond pads on an integrated circuit.

25. The circuitry of claim 21, wherein a first stage in the first path after the power supply boundary comprises a level translator, and wherein a first stage in the second path after the power supply boundary comprises a level translator.

26. The circuitry of claim 21, further comprising at least one data output.

27. The circuitry of claim 26, wherein the first and second output signals comprise a differential data strobe signal for synchronizing the at least one data output.

28. The circuitry of claim 27, wherein there are a plurality of data outputs each at a bond pad, and wherein the first and second differential data strobe signals are each at a bond pad.

29. The circuitry of claim 21, wherein there are N first stages and N second stages, wherein N is an integer.

30. The circuitry of claim 29, wherein the first power supply voltage powers an odd number of first stages, and an even number of second stages.

31. The circuitry of claim 29, wherein the first power supply voltage powers X first stages, and X+1 second stages, and wherein the second power supply voltage powers N−X of the first stages, and N−X−1 of the second stages; wherein X is an integer, and N−X is greater than or equal to 2.

32. The circuitry of claim 29, wherein a last of the first stages and a last of the second stages comprises serially-connected pull up and pull down transistors, and wherein the first and second output signals are formed between the pull up and pull down transistors.

33. The circuitry of claim 21, wherein at least one of the first stages and at least one of the second stages comprise inverters.

* * * * *

UNITED STATES PATENT AND TRADEMARK OFFICE
CERTIFICATE OF CORRECTION

| | |
|---|---|
| PATENT NO. | : 8,269,540 B2 |
| APPLICATION NO. | : 13/039998 |
| DATED | : September 18, 2012 |
| INVENTOR(S) | : Bryce Cook |

It is certified that error appears in the above-identified patent and that said Letters Patent is hereby corrected as shown below:

In column 10, line 12, in Claim 2, after "plurality" insert -- of --.

Signed and Sealed this
Twentieth Day of November, 2012

David J. Kappos
*Director of the United States Patent and Trademark Office*